United States Patent
Satoh

(10) Patent No.: US 11,183,588 B2
(45) Date of Patent: Nov. 23, 2021

(54) SEMICONDUCTOR DEVICE AND INVERTER

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 16/774,691

(22) Filed: Jan. 28, 2020

(65) Prior Publication Data

US 2021/0057555 A1 Feb. 25, 2021

(30) Foreign Application Priority Data

Aug. 22, 2019 (JP) .............................. JP2019-151898

(51) Int. Cl.
*H01L 29/739* (2006.01)
*H01L 29/10* (2006.01)
(Continued)

(52) U.S. Cl.
CPC .......... *H01L 29/7397* (2013.01); *H01L 24/05* (2013.01); *H01L 29/0619* (2013.01);
(Continued)

(58) Field of Classification Search
CPC ... H01L 2224/0401; H01L 2224/05567; H01L 2224/32245; H01L 2224/33181; H01L 2224/73215; H01L 2224/73265; H01L 24/05; H01L 24/32; H01L 24/33; H01L 24/73; H01L 29/0619; H01L 29/0696; H01L 29/0804; H01L 29/0821; H01L 29/1004; H01L 29/1095; H01L 29/42304; H01L 29/4236; H01L 29/7397;
(Continued)

(56) References Cited

U.S. PATENT DOCUMENTS

| | | | |
|---|---|---|---|
| 2010/0140658 A1* | 6/2010 | Koyama | ............... H01L 29/861 257/140 |
| 2017/0213908 A1* | 7/2017 | Fursin | ................. H01L 29/0615 |
| 2019/0245070 A1* | 8/2019 | Yilmaz | ............... H01L 29/7397 |

FOREIGN PATENT DOCUMENTS

JP 2010-123667 A 6/2010
JP 2010123667 A * 6/2010 ......... H01L 29/4236

* cited by examiner

*Primary Examiner* — Jonathan Han
(74) *Attorney, Agent, or Firm* — Studebaker & Brackett PC

(57) ABSTRACT

A semiconductor device includes: a semiconductor base having a first main surface and a second main surface which are opposite to each other; a first main electrode formed on the first main surface and electrically connected to the semiconductor base; a first control electrode pad formed on the first main surface; a first insulating film interposed between the semiconductor base and the first control electrode pad; a peripheral withstand voltage holding structure formed in a peripheral region surrounding the first main electrode and the first control electrode pad on the first main surface; a second main electrode formed on the second main surface and electrically connected to the semiconductor base; a second control electrode pad formed on the second main surface; and a second insulating film interposed between the semiconductor base and the second control electrode pad, wherein the second control electrode pad is surrounded by the second main electrode.

11 Claims, 6 Drawing Sheets

(51) Int. Cl.

| | |
|---|---|
| *H01L 29/423* | (2006.01) |
| *H01L 29/08* | (2006.01) |
| *H01L 23/00* | (2006.01) |
| *H01L 29/06* | (2006.01) |
| *H02M 7/5387* | (2007.01) |
| *H02P 27/06* | (2006.01) |
| *H02M 5/458* | (2006.01) |

(52) U.S. Cl.
CPC ...... *H01L 29/0804* (2013.01); *H01L 29/0821* (2013.01); *H01L 29/1004* (2013.01); *H01L 29/1095* (2013.01); *H01L 29/4236* (2013.01); *H01L 29/42304* (2013.01); *H02M 7/53871* (2013.01); *H01L 24/32* (2013.01); *H01L 24/33* (2013.01); *H01L 24/73* (2013.01); *H01L 29/0696* (2013.01); *H01L 2224/0401* (2013.01); *H01L 2224/05567* (2013.01); *H01L 2224/32245* (2013.01); *H01L 2224/33181* (2013.01); *H01L 2224/73215* (2013.01); *H01L 2224/73265* (2013.01); *H01L 2924/13055* (2013.01); *H02M 5/4585* (2013.01); *H02P 27/06* (2013.01)

(58) Field of Classification Search
CPC ....... H01L 2924/13055; H01L 29/7375; H01L 29/7393–7395; H01L 29/66325; H01L 29/66333–66348; H01L 29/0615; H01L 29/0638; H01L 29/4232; H01L 29/4238; H01L 23/367; H01L 29/0834; H02M 5/4585; H02M 7/53871; H02M 5/458; H02M 7/003; H02P 27/06
See application file for complete search history.

SEMICONDUCTOR DEVICE AND INVERTER

BACKGROUND OF THE INVENTION

Field

The present invention relates to a semiconductor device having a double gate structure including control electrodes on cathode and anode sides and an inverter using the semiconductor device as a switching device.

Background

A circuit in which an AC-DC converter for converting alternating current (AC) into direct current (DC) is combined with a DC-AC converter to perform conversion to an arbitrary frequency or voltage is called an "inverter." Since the inverter can variably control an output voltage and its frequency, the inverter can freely control a rotating speed of a motor and is used as a variable speed apparatus for the motor.

In past days, bipolar transistors were used as switching devices for inverters for small capacity areas, and gate turn-off thyristors (GTO) were used for medium-large capacity areas. Currently, insulated gate bipolar transistors (IGBT) are mainly used, which achieves both high controllability/high speed by voltage control using a MOS gate structure and high current carrying performance that is a main feature of bipolar devices.

Semiconductor devices having the double gate structure have been devised to especially improve switching performance of bipolar devices. Research into double gate IGBTs applying the double gate structure to IGBTs is currently underway. A double gate IGBT has a structure in which a gate electrode is formed on an emitter-side main surface and a control gate electrode is formed on a collector-side main surface on the opposite side to the emitter-side main surface (e.g., see JP 2010-123667 A).

SUMMARY

A peripheral withstand voltage holding structure is formed on a peripheral region of the emitter-side main surface. Electrodes of the peripheral withstand voltage holding structure are not connected to external lead electrodes and covered with a protective film of low thermal conductivity. On the other hand, a control gate electrode pad is positioned at an outer peripheral portion of the collector-side main surface and is electrically connected to a lead frame via solder. A gate insulating film of low thermal conductivity is interposed between a control gate electrode pad and a $p^+$-type collector layer. Since only one outer peripheral side of the control gate electrode pad faces the collector electrode and is insulated by an insulating film, heat is not easily dissipated from the control gate electrode pad side to the collector electrode side. Therefore, conventional double gate IGBTs have structures in which heat is dissipated easily from neither the emitter-side main surface nor the collector-side main surface. Since the conventional double gate IGBTs thus have both of a region of high heat dissipation efficiency where a main electrode is formed and the peripheral region of low heat dissipation efficiency, the temperature in the double gate IGBTs is likely to become non-uniform when a large loss occurs. Especially when a short circuit accident occurs, which may trigger a drastic temperature change, a risk of causing thermal breakdown near the peripheral region or the gate electrode pad increases.

The present invention has been made to solve the above-described problems, and it is an object of the present invention to provide a semiconductor device and an inverter capable of reducing the risk of causing thermal breakdown.

A semiconductor device according to the present disclosure includes: a semiconductor base having a first main surface and a second main surface which are opposite to each other; a first main electrode formed on the first main surface and electrically connected to the semiconductor base; a first control electrode pad formed on the first main surface; a first insulating film interposed between the semiconductor base and the first control electrode pad; a peripheral withstand voltage holding structure formed in a peripheral region surrounding the first main electrode and the first control electrode pad on the first main surface; a second main electrode formed on the second main surface and electrically connected to the semiconductor base; a second control electrode pad formed on the second main surface; and a second insulating film interposed between the semiconductor base and the second control electrode pad, wherein the second control electrode pad is surrounded by the second main electrode.

In the present disclosure, the second control electrode pad is surrounded by the second main electrode which is a heat dissipation path. This facilitates heat dissipation from the peripheral region of the second control electrode pad, and can thereby reduce temperature non-uniformity. As a result, it is possible to improve the operation performance of the semiconductor device and reduce the risk of causing thermal breakdown.

Other and further objects, features and advantages of the invention will appear more fully from the following description.

DESCRIPTION OF EMBODIMENTS

A semiconductor device and an inverter according to the embodiments of the present disclosure will be described with reference to the drawings. The same components will be denoted by the same symbols, and the repeated description thereof may be omitted.

First Embodiment

Figure 1:
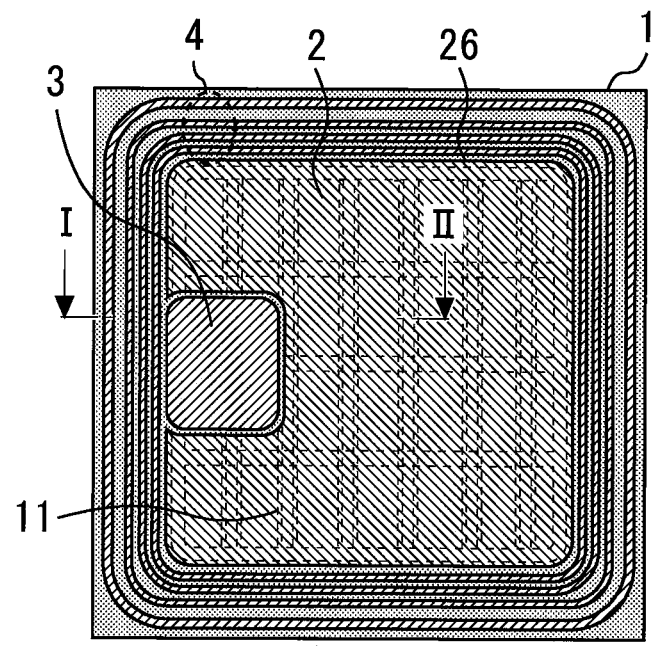
FIG. 1 is a plan view of an emitter-side main surface of a semiconductor device according to a first embodiment.

FIG. 1 is a plan view of an emitter-side main surface of a semiconductor device according to a first embodiment. A semiconductor base 1 is obtained by epitaxially growing a semiconductor layer on a semiconductor substrate and has an emitter-side main surface and a collector-side main surface, which are opposite to each other. An emitter-side IGBT region including an emitter electrode 2 and a gate electrode pad 3, and a peripheral region surrounding the emitter-side IGBT region are formed on the emitter-side main surface of the semiconductor base 1. The emitter electrode 2 is provided so as to surround three sides of the gate electrode pad 3. A peripheral withstand voltage holding structure 4 is formed in the peripheral region.

Figure 2:
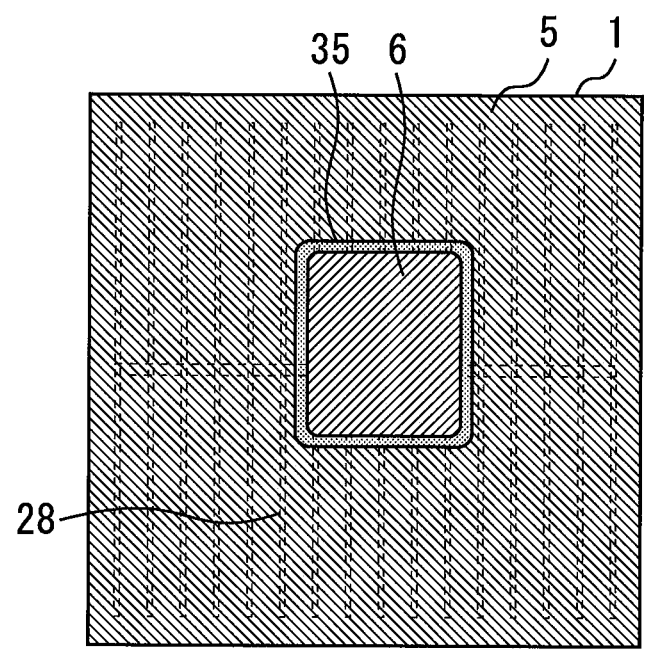
FIG. 2 is a plan view of the collector-side main surface of the semiconductor device according to the first embodiment.

FIG. 2 is a plan view of the collector-side main surface of the semiconductor device according to the first embodiment. A collector-side IGBT region including a collector electrode 5 and a control gate electrode pad 6 is formed on the collector-side main surface. In the present embodiment, the control gate electrode pad 6 is positioned at the center of the chip and the entire peripheral region thereof is surrounded by the collector electrode 5. The collector electrode 5 is provided so as to cover the region of the collector-side main surface other than the control gate electrode pad 6. Therefore, the collector electrode 5 is positioned in the entire peripheral region of the collector-side main surface facing the peripheral withstand voltage holding structure 4.

Figure 3:
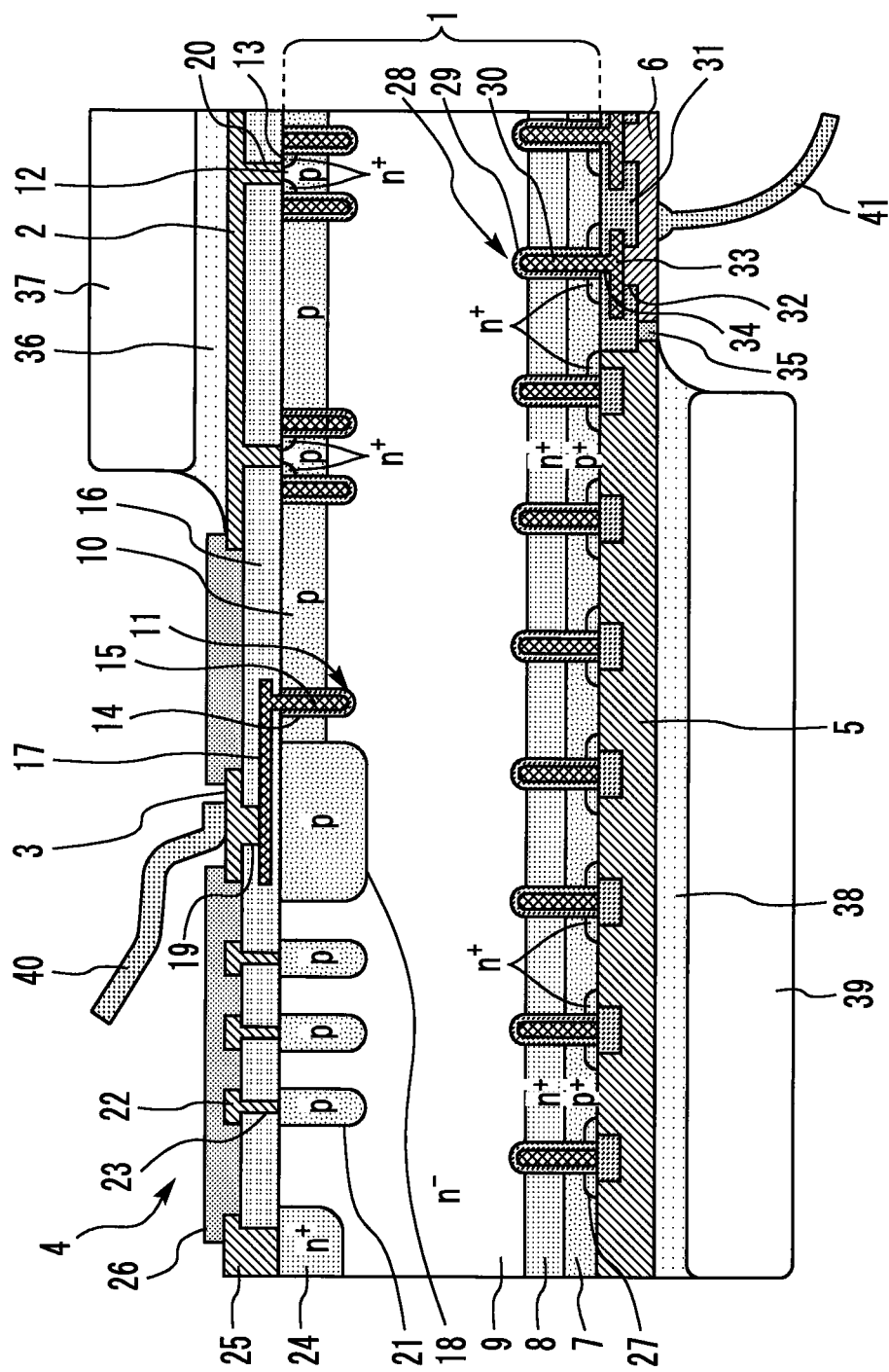
FIG. 3 is a cross-sectional view along I-II in FIG. 1.

FIG. 3 is a cross-sectional view along I-II in FIG. 1. A field stop layer 8 composed of an $n^+$-type impurity layer of high impurity concentration is formed on a $p^+$-type collector layer 7. An $n^-$-type drift layer 9 of lower impurity concentration than that of the field stop layer 8 is formed on the field stop layer 8. A p-type base layer 10 having a predetermined thickness is formed on the $n^-$-type drift layer 9.

A plurality of trenches 11 are formed so as to penetrate the p-type base layer 10 and reach the $n^-$-type drift layer 9. The plurality of trenches 11 are provided at a predetermined pitch (interval) and have a striped structure with the trenches extending in a depth direction in FIG. 3, that is, with the trenches extending in parallel to the vertical direction of the paper surface or an annular structure with the trenches extending in parallel to the vertical direction of the paper surface and then being turned around at their distal ends.

The p-type base layer 10 is divided into a plurality of portions by the plurality of trenches 11. Some of the divided portions are p-channel layers 12 constituting channel regions. An $n^+$-type emitter region 13 is formed on a side face of the trench 11 in a surface layer of the p-channel layer 12. The $n^+$-type emitter region 13 has higher impurity concentration than that of the n-type drift layer 9 and is terminated in the p-type base layer 10.

A gate insulating film 14 is formed so as to cover an inner wall surface of each trench 11. A gate electrode 15 made of doped polysilicon or the like is formed on the gate insulating film 14 in the trench 11. An insulating film 16 is formed on the emitter-side main surface of the semiconductor base 1 so as to cover the top of the gate electrode 15.

A p-type diffusion layer 18 is formed on the $n^-$-type drift layer 9 so as to surround the p-type base layer 10. A doped polysilicon layer 17 is formed above the p-type diffusion layer 18 with the insulating film 16 interposed therebetween. The doped polysilicon layer 17 is electrically connected to the gate electrode 15 and electrically connected to the gate electrode pad 3 through a contact hole 19 formed in the insulating film 16. Therefore, the gate electrode 15 is electrically connected to an external part via the doped polysilicon layer 17 and the gate electrode pad 3.

The emitter electrode 2 is formed on the insulating film 16. The emitter electrode 2 is electrically connected to the $n^+$-type emitter region 13 and the p-channel layer 12 through a contact hole 20 formed in the insulating film 16. In this way, the emitter-side IGBT region is constructed.

In the peripheral region surrounding the emitter-side IGBT region, a plurality of p-type guard ring layers 21 are formed on the n-type drift layer 9 as a multiplexed ring structure. The p-type diffusion layer 18 and the p-type guard ring layers 21 are formed deeper than the p-type base layers 10. A plurality of outer peripheral electrodes 22 are provided on the insulating film 16 so as to correspond to the plurality of p-type guard ring layers 21. The plurality of p-type guard ring layers 21 are electrically connected to the respective outer peripheral electrodes 22 through contact holes 23 formed in the insulating film 16. The plurality of outer peripheral electrodes 22 are electrically separate from each other and have a multiplexed ring structure as in the case of the p-type guard ring layers 21.

An $n^+$-type layer 24 is formed on the surface layer of the $n^-$-type drift layer 9 so as to surround the p-type guard ring layers 21. An electrode 25 is formed on the $n^+$-type layer 24 and they are electrically connected together. The $n^+$-type layer 24 and the electrode 25 constitute an equipotential ring (EQR) structure. Parts of the peripheral region to which no electrical connection is made are covered with a protective film 26. The peripheral withstand voltage holding structure 4 of the peripheral region of the emitter-side main surface is constructed in this way.

High concentration $n^+$-type collector layers 27 are selectively formed on the collector side surface of the $p^+$-type collector layer 7. A plurality of trenches 28 are formed so as to penetrate the $p^+$-type collector layer 7, the $n^+$-type collector layer 27 and the field stop layer 8 and reach the $n^-$-type drift layer 9. The plurality of trenches 28 are provided in a striped shape at a predetermined interval, for example, at equal intervals.

A gate insulating film 29 is formed so as to cover the inner wall surface of each trench 28. A control gate electrode 30 made of doped polysilicon or the like is formed on the gate insulating film 29 in the trench 28.

All the control gate electrodes 30 are electrically connected to each other in separate cross sections. The collector electrode 5 is in contact and electrically connected with the $p^+$-type collector layer 7 and the $n^+$-type collector layer 27. An insulating film 31 is formed on the collector-side main surface of the semiconductor base 1 so as to cover the control gate electrode 30.

The control gate electrode pad 6 is electrically connected to a doped polysilicon layer 33 through a contact hole 32 formed in the insulating film 31. The doped polysilicon layer 33 is connected to the control gate electrode 30 through a contact hole 34 formed in the insulating film 31. The collector electrode 5 is provided so as to surround the control gate electrode pad 6, a peripheral region of which is covered with the protective film 35, and is separated from the control gate electrode 30 by the insulating film 31 and the protective film 35. The collector-side IGBT region is constructed in this way.

The double gate IGBT according to the present embodiment is constructed as described above. The double gate IGBT is connected to the external part as described below. The emitter electrode 2 is connected to a lead frame 37 which is an external lead electrode via solder 36. The collector electrode 5 is connected to a lead frame 39 which is an external lead electrode via solder 38. A current flows between the collector and the emitter through the lead frame 39, the solder 38, the collector electrode 5, the semiconductor base 1, the emitter electrode 2, the solder 36 and the lead frame 37.

Electrical connection between the gate electrode 15 and the outside is achieved by bonding a bonding wire 40 to the gate electrode pad 3. A voltage can be applied to the control gate electrode 30 by joining a bonding wire 41 to the control gate electrode pad 6. The double gate IGBT as a whole is packaged by coating with resin or the like and part of the external lead electrode protrudes to the outside of the packaging, which constitutes a contact with the apparatus. Since the emitter electrode 2 and the collector electrode 5 are connected to the lead frames 37 and 39 which are the external lead electrodes via the solder 36 and 38, it is possible to secure a large heat dissipation area, a total volume of the region over which heat spreads in several microseconds and a heat capacity.

Next, operation of the semiconductor device according to the present embodiment will be described. First, since no gate voltage is applied to the gate electrode 15 in an OFF state, no inversion layer is formed in the p-channel layer 12. For this reason, the current between the collector and the emitter is turned OFF. When a positive gate voltage is applied to the gate electrode 15, an inversion layer is formed in the p-channel layer 12, a current flows between the collector and the emitter, resulting in an ON state.

In this operation, when a positive voltage with respect to the collector voltage (e.g., voltage V>0) is applied to the control gate electrode 30, this voltage forms an n-channel layer in the $p^+$-type collector layer 7 via the gate insulating film 29. When the $n^+$-type collector layer 7, the n-channel layer and the field stop layer 8 become a conduction path, which causes a bias potential of pn junction composed of the $p^+$-type collector layer 7 and the field stop layer 8 to decrease. Therefore, the hole quantity injected from the $p^+$-type collector layer 7 to the $n^+$-type emitter region 13 side is reduced during an ON state. The conduction path constructed of the $n^+$-type collector layer 7, the n-channel layer and the field stop layer 8 becomes an outflow path for electrons accumulated in the $n^-$-type drift layer 9 to the collector electrode 5 during turn-off switching operation. For this reason, annihilation of electrons accumulated in the $n^-$-type drift layer 9 is fastened. Therefore, it is possible to reduce a switching loss while increasing a steady-state loss as device characteristics.

On the other hand, when a negative voltage with respect to the collector voltage (e.g., voltage V<0) is applied to the control gate electrode 30, this voltage affects the field stop layer 8 and the $p^+$-type collector layer 7 which becomes the collector region via the gate insulating film 29. Thus, in the $p^+$-type collector layer 7, holes move in a direction in which they are accumulated. In the field stop layer 8, electrons move in a direction in which they are reduced. Thus, the hole quantity injected from the $p^+$-type collector layer 7 to the $n^+$-type emitter region 13 side increases during an ON state. Therefore, it is possible to reduce a steady-state loss while increasing a switching loss as device characteristics.

As described above, the control gate electrode 30 can adjust the hole quantity in the $p^+$-type collector layer 7 which becomes the collector region of the IGBT and the electron quantity in the field stop layer 8. It is therefore possible to adjust a steady-state loss and a switching loss of the semiconductor device to optimum values after the device manufacturing process ends. Furthermore, an application designer or an apparatus user can set optimum losses in accordance with use conditions of the drive frequency or the like by controlling the voltage applied to the control gate electrode 30. Furthermore, development of time-consuming custom device manufacturing steps such as adjustment of device manufacturing conditions and repetition of try and error of application evaluation becomes unnecessary. Even when the drive frequency and temperature change during operation, it is possible to set the device performance such as loss characteristics and surge characteristics to values optimum for the frequency and temperature by adjusting the voltage applied to the control gate electrode 30.

Figure 4:
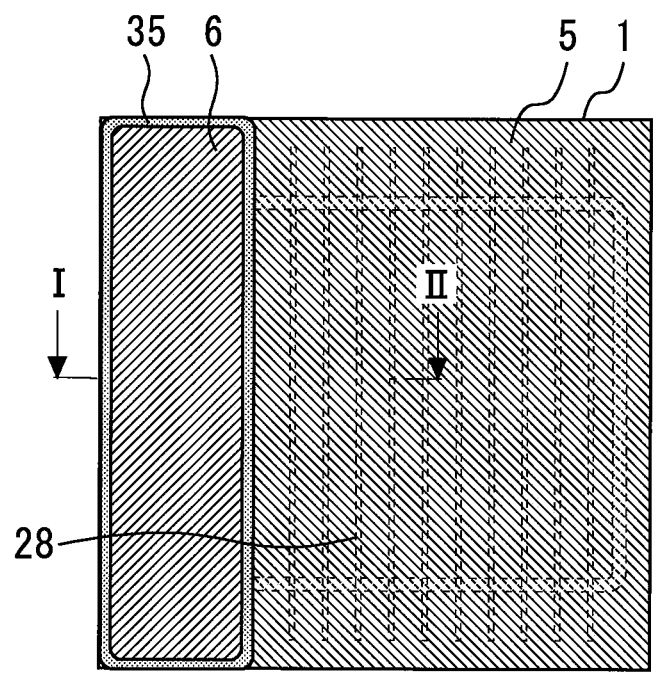
FIG. 4 is a plan view of the collector-side main surface of the semiconductor device according to a comparative example.
Figure 5:
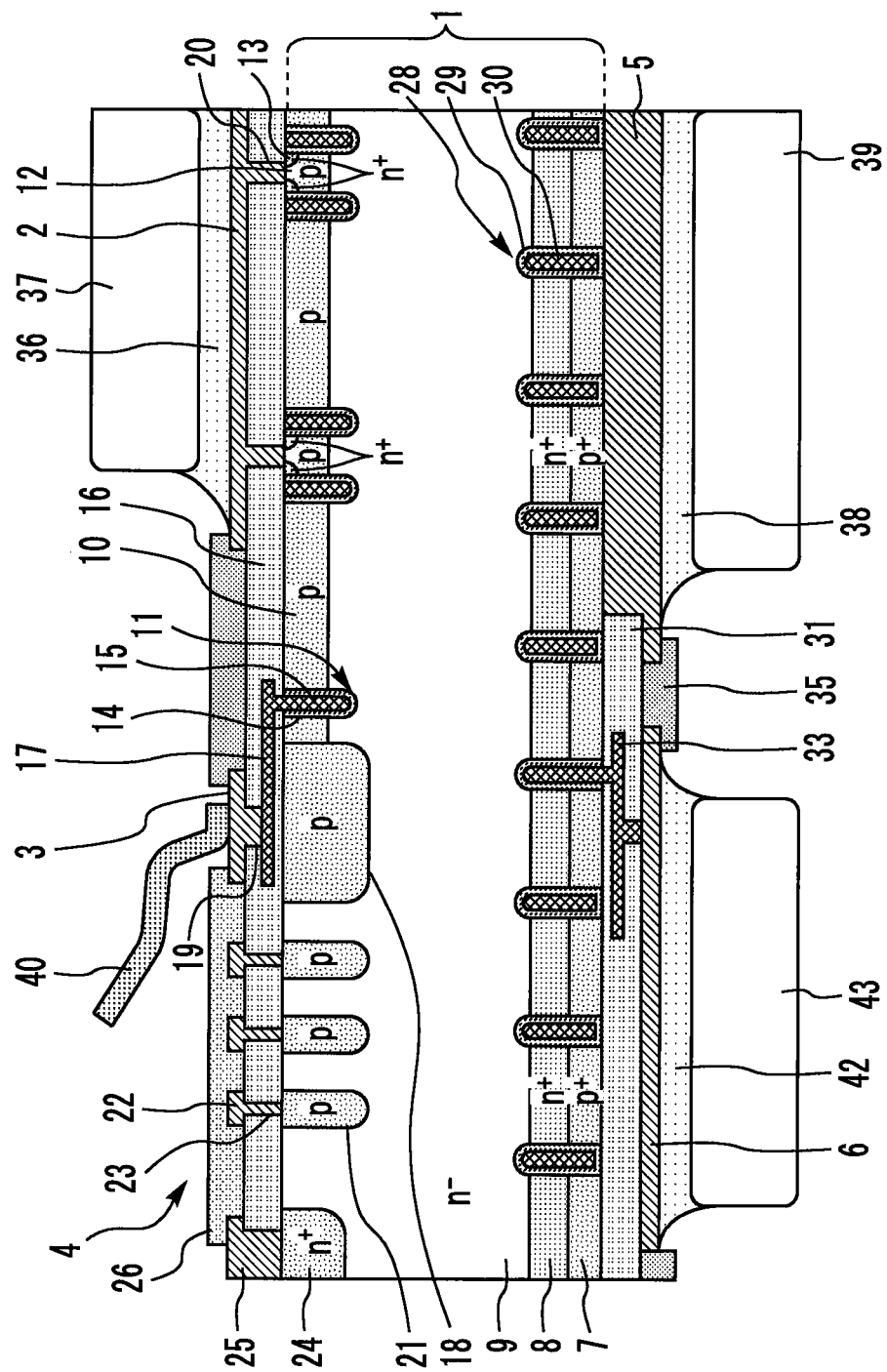
FIG. 5 is a cross-sectional view along I-I in FIG. 4.

Next, effects of the present embodiment will be described in comparison with comparative examples. FIG. 4 is a plan view of the collector-side main surface of the semiconductor device according to a comparative example. FIG. 5 is a cross-sectional view along I-II in FIG. 4. In the comparative example, the control gate electrode pad 6 is positioned in the peripheral region of the collector-side main surface. Only one side of the peripheral region of the control gate electrode pad 6 faces the collector electrode 5 and is insulated and separated by the insulating film 31 and the protective film 35. The control gate electrode pad 6 is electrically connected to the lead frame 43 which is the external lead electrode via the solder 42.

The heat of the semiconductor base 1 generated by a loss is dissipated from the collector-side main surface using the collector electrode 5 electrically connected to the semiconductor base 1 and the lead frame 39 connected to the collector electrode 5 as a heat dissipation path. Therefore, the larger the contact area between the semiconductor base 1 and the collector electrode 5, the contact area between the collector electrode 5 and the lead frame 39 or the larger the thermal conductivity of the collector electrode 5 and the lead frame 39, the more efficiently the heat is dissipated. On the other hand, the gate insulating film 29 having small thermal conductivity is interposed between the control gate electrode pad 6 and the semiconductor base 1. For this reason, heat is not easily dissipated from the control gate electrode pad 6.

In the comparative example, only one side of the peripheral region of the control gate electrode pad 6 faces the collector electrode 5, and so heat is not easily dissipated from the control gate electrode pad 6 side to the collector electrode 5 side. In contrast, in the present embodiment, the control gate electrode pad 6 is surrounded by the collector electrode 5 which is a heat dissipation path. This facilitates heat dissipation from the peripheral region of the control gate electrode pad 6, and can thereby reduce temperature non-uniformity. As a result, it is possible to improve the operation performance of the semiconductor device and reduce the risk of causing thermal breakdown.

Furthermore, the gate insulating film 29 of low thermal conductivity is interposed between the control gate electrode pad 6 and the semiconductor base 1, and so heat of the semiconductor base 1 is not easily dissipated from the control gate electrode pad 6. Therefore, the heat of the region of the control gate electrode pad 6 needs to be dissipated from the emitter-side main surface. More specifically, when more than half of the region of the emitter-side main surface facing the control gate electrode pad 6 is positioned outside the region of the emitter electrode 2, heat dissipation to the emitter electrode 2 reduces, which may start affecting the IGBT performance and reduce short circuit tolerance to approximately ⅔ or below.

In contrast, in the present embodiment, the control gate electrode pad 6 is positioned at the center of the collector-side main surface of the semiconductor base 1. Therefore, the region of the emitter-side main surface facing the control gate electrode pad 6 is not the peripheral region from where heat is not easily dissipated, but is the region in which the emitter electrode 2 is formed. Since the emitter electrode 2 is electrically connected to the $n^+$-type emitter region 13, the region in which the emitter electrode 2 is formed is excellent in heat dissipation. This makes it possible to secure excellent heat dissipation.

Note that heat is also dissipated to a certain degree from the gate electrode pad 3 via the bonding wire 40, and so the region of the emitter-side main surface facing the control gate electrode pad 6 may be the region in which the gate electrode pad 3 is formed.

In the event of a short circuit accident, even if the device can manage to remain safe without thermal breakdown and be protected from current interruption, a supply voltage VCE is applied to the IGBT immediately after completion of the protective operation. A leakage current caused by a supply voltage flows at a high temperature section of the IGBT caused by temperature non-uniformity, a product of the leakage current and the supply voltage is generated as a loss and consumed as heat. The leakage current increases when the temperature is high and if a loss by the leakage current is large with respect to the amount of heat dissipation, positive feedback may be applied, leading to thermal breakdown. For this reason, it is important to provide a structure of the IGBT that prevents temperature non-uniformity. Particularly in the peripheral region where the peripheral withstand voltage holding structure 4 for blocking the voltage is formed, a leakage current density is likely to become larger than the region in which the emitter electrode 2 is formed. The peripheral region of the emitter-side main surface has substantially no efficient heat dissipation path. In contrast, in the present embodiment, the collector electrode 5 is positioned in the peripheral region of the collector-side main surface facing the peripheral withstand voltage holding structure 4. The collector electrode 5 is electrically connected to the lead frame 39 which is the external lead electrode via the solder 38. Therefore, the peripheral region of the collector-side main surface also has a heat dissipation path.

Furthermore, the bonding wire 41 is joined to the control gate electrode pad 6 as the external lead electrode. The bonding wire 41 has higher positioning accuracy with respect to the control gate electrode pad 6 compared to a case where the lead frame 43 is soldered as the comparative example. Therefore, it is possible to reduce misalignment and reduce the size of the control gate electrode pad 6. This makes it possible to relatively increase the size of the collector electrode 5, thereby improve heat dissipation from the collector electrode 5 and reduce temperature non-uniformity caused by the control gate electrode pad 6.

Second Embodiment

Figure 6:
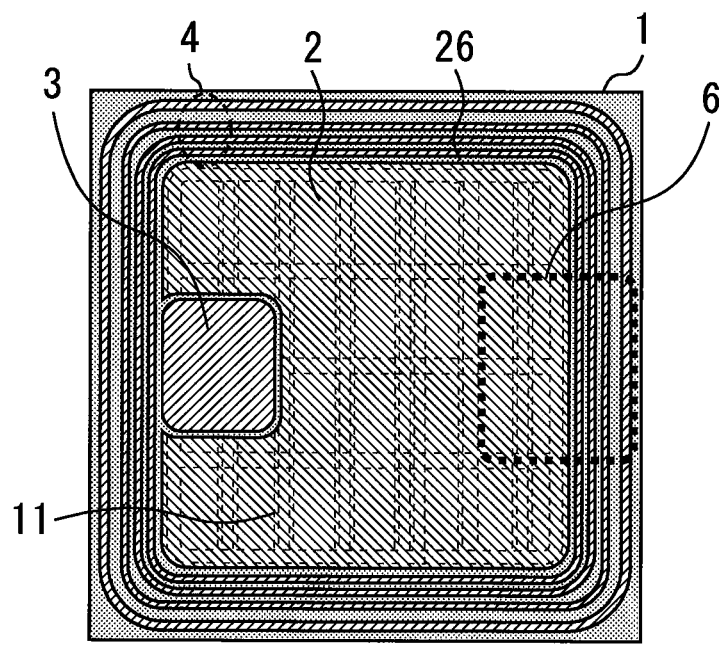
FIG. 6 is a plan view of an emitter main surface side of a semiconductor device according to a second embodiment.
Figure 7:
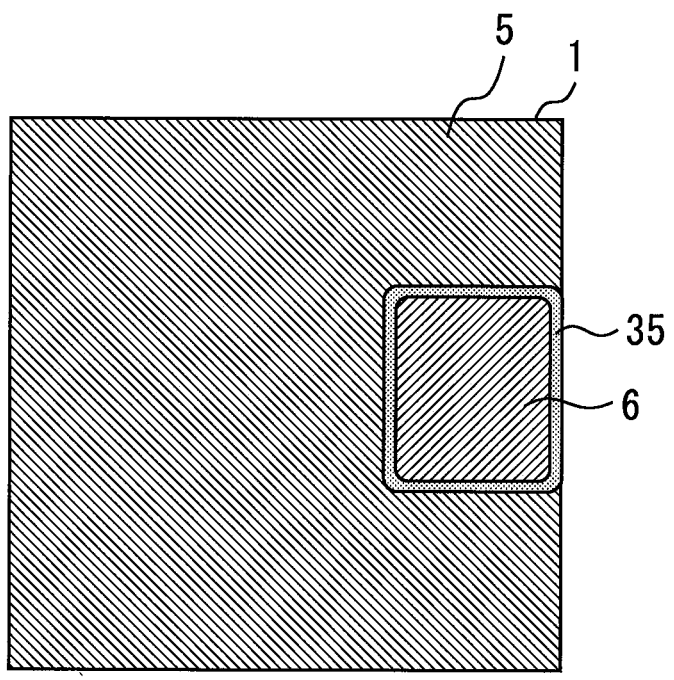
FIG. 7 is a plan view of a collector-side main surface of the semiconductor device according to the second embodiment.

FIG. 6 is a plan view of an emitter main surface side of a semiconductor device according to a second embodiment. FIG. 7 is a plan view of a collector-side main surface of the semiconductor device according to the second embodiment. The size and the position of the control gate electrode pad 6 in the second embodiment are different from those in the first embodiment. The control gate electrode pad 6 is a rectangle having a size of 1.2 mm×1.5 mm, and one side of the rectangle is located at a peripheral end of the chip.

An index of heat dissipation efficiency with respect to the collector electrode 5 is calculated by dividing the unit perimeter of the control gate electrode pad 6 by the unit area of the control gate electrode pad 6. The index can be increased by downsizing the control gate electrode pad 6 to achieve rapid heat dissipation and reduce temperature non-uniformity. Furthermore, since the plane shape of the control gate electrode pad 6 is rectangular, even when one side is located at a peripheral end of the chip which is not surrounded by the collector electrode 5, heat is dissipated from three sides surrounded by the collector electrode 5 to the collector electrode 5 side.

Note that the plane shape of the control gate electrode pad 6 is not limited to rectangular, but may be semicircular, fan-shaped, pentagonal or higher polygonal. In any case, it is only required that any part other than the one side of the perimeter of the control gate electrode pad 6 be surrounded by the collector electrode 5. Thus, heat is dissipated from the surrounded part to the collector electrode 5. More specifically, it is preferable that 75% or more of the perimeter of the control gate electrode pad 6 be surrounded by the collector electrode 5. In this case, if the control gate electrode pad 6 can be downsized, an effect equivalent to surrounding the whole perimeter can be obtained. For example, when the control gate electrode pad 6 is reduced to a size of 1.2 mm×1.5 mm as in the case of the present embodiment, such temperature non-uniformity that affects the IGBT performance may not be generated.

The collector electrode 5 is positioned in the region facing the gate electrode pad 3 and the emitter electrode 2 is positioned in the region facing the control gate electrode pad 6. That is, the gate electrode pad 3 and the control gate electrode pad 6 are positioned such that they do not overlap when projected in a plan view. Therefore, the gate electrode pad 3 and the control gate electrode pad 6 are not provided in regions facing each other. It is thereby possible to prevent heat from being accumulated between the gate electrode pad 3 and the control gate electrode pad 6 which are inferior in heat dissipation.

The double gate structure according to the first or second embodiment is not limited to an IGBT that allows short circuit protection and self-shutdown operation, but is also applicable to a device such as a GTO which does not have current saturation characteristics and cannot perform short circuit protection and self-shutdown. For example, when an OFF voltage is applied immediately after temperature non-uniformity caused by a temperature rise in the GTO due to a surge current, thermal runaway due to a leakage current may occur. Therefore, a reduction of temperature non-uniformity is also important to the GTO. However, since the GTO has an operating frequency approximately 1 to 2 digits lower than that of the IGBT, the influence of the present embodiment is not significantly large. On the other hand, for transistors for which a self-shutdown operation for protection against short circuit is required, temperature non-uniformity for several microseconds affects the performance, and so the configuration according to the first or second embodiment is particularly effective.

The semiconductor base 1 is not limited to a base formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Third Embodiment

Figure 8:
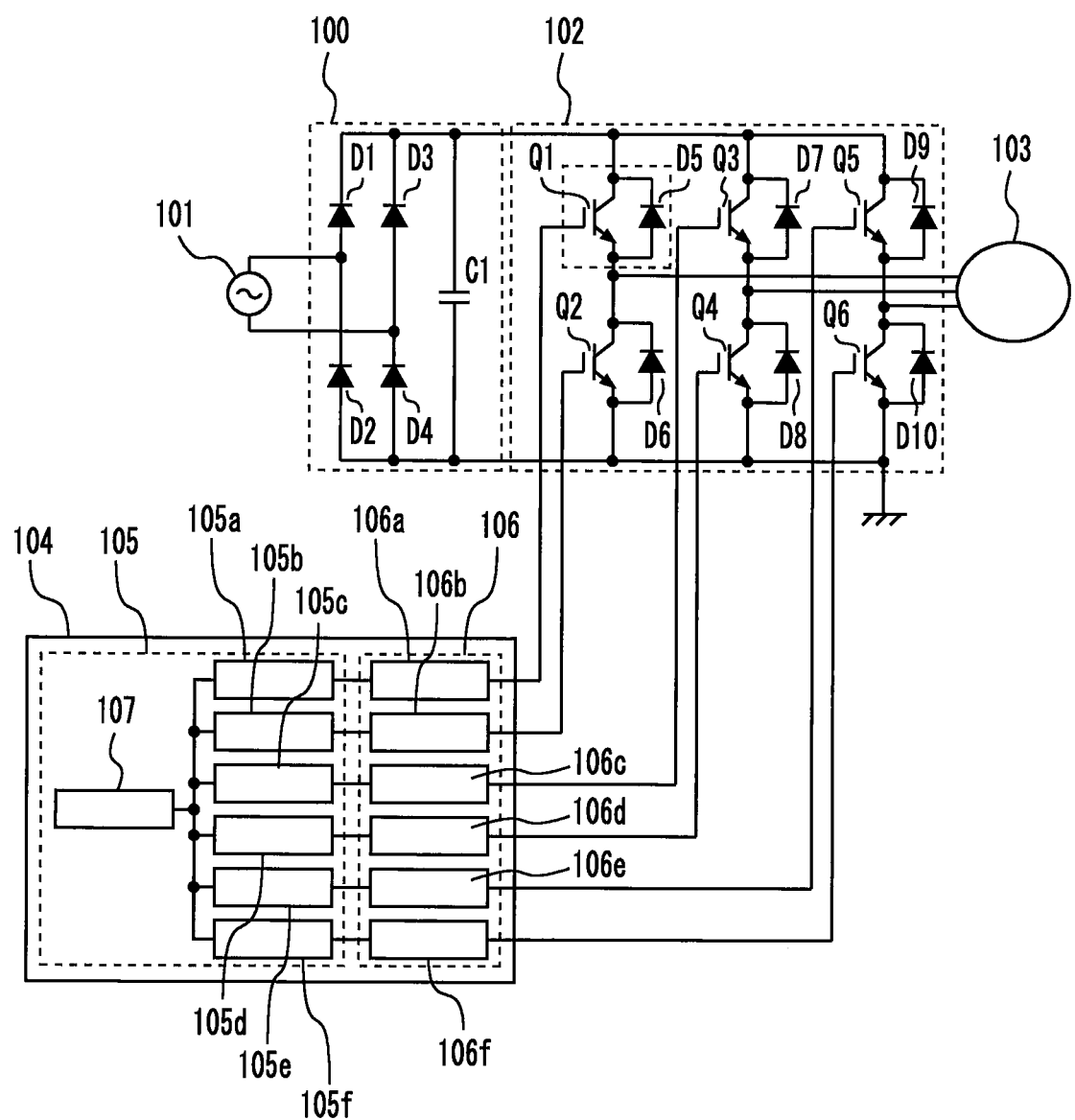
FIG. 8 is a diagram illustrating an inverter according to a third embodiment.

FIG. 8 is a diagram illustrating an inverter according to a third embodiment. An AC-DC converter 100 converts AC power of a power supply 101 to DC power. The AC-DC converter 100 includes diodes D1, D2, D3 and D4 and a power supply smoothing capacitor C1. ADC-AC inverter 102 converts the DC power outputted from the AC-DC converter 100 to AC power and supplies the AC power to a coil of a motor 103. The DC-AC inverter 102 includes switching devices Q1 to Q6 such as an IGBT and free-wheel diodes D5 to D10 connected in reverse parallel to the switching devices Q1 to Q6. A drive circuit 104 drives the switching devices Q1 to Q6. The drive circuit 104 includes a signal processing section 105 and an output section 106. The signal processing section 105 includes a microcomputer 107 and signal processing circuits 105a to 105f that process signals from the microcomputer 107. The output section 106 includes output circuits 106a to 106f that output control signals from the signal processing circuits 105a to 105f to the respective switching devices Q1 to Q6. Using the semiconductor device according to the first or second embodiment as the switching devices Q1 to Q6 makes it possible to reduce the risk of causing thermal breakdown, and thereby obtain a highly reliable inverter.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2019-151898, filed on Aug. 22, 2019 including specification, claims, drawings and summary, on which the convention priority of the present application is based, is incorporated herein by reference in its entirety.

The invention claimed is:

1. A semiconductor device comprising:
   a semiconductor base having a first main surface and a second main surface which are opposite to each other;
   a first main electrode formed on the first main surface and electrically connected to the semiconductor base;
   a first control electrode pad formed on the first main surface;
   a first insulating film interposed between the semiconductor base and the first control electrode pad;
   a peripheral withstand voltage holding structure formed in a peripheral region surrounding the first main electrode and the first control electrode pad on the first main surface;
   a second main electrode formed on the second main surface in the peripheral region and electrically connected to the semiconductor base;
   a second control electrode pad formed on the second main surface; and
   a second insulating film interposed between the semiconductor base and the second control electrode pad,
   wherein the second control electrode pad is surrounded by the second main electrode.

2. The semiconductor device according to claim 1, wherein a region of the first main surface facing the second control electrode pad is not the peripheral region.

3. The semiconductor device according to claim 2, wherein a region of the first main surface facing the second control electrode pad is a region in which the first main electrode is formed.

4. The semiconductor device according to claim 1, wherein sides other than one side of the second control electrode pad is surrounded by the second main electrode.

5. The semiconductor device according to claim 1, wherein the second main electrode is positioned in a region of the second main surface facing the peripheral withstand voltage holding structure.

6. The semiconductor device according to claim 1, wherein a bonding wire is bonded to the second control electrode pad.

7. The semiconductor device according to claim 1, wherein the first control electrode pad and the second control electrode pad are not provided in regions facing each other.

8. The semiconductor device according to claim 1, further comprising a transistor formed in the semiconductor base.

9. The semiconductor device according to claim 8, wherein the transistor includes:
   a collector layer of a first conductivity type electrically connected to the second main electrode;
   a drift layer of a second conductivity type formed on the collector layer;
   a base layer of the first conductivity type formed on the drift layer;
   a first trench penetrating the base layer;
   a gate electrode formed on the first insulating film in the first trench and electrically connected to the first control electrode pad;
   an emitter region of the second conductivity type formed on a side face of the first trench in the base layer and electrically connected to the first main electrode;
   a second trench formed in the collector layer; and
   a control gate electrode formed on the second insulating film in the second trench and electrically connected to the second control electrode pad.

10. The semiconductor device according to claim 1, wherein the semiconductor base is made of a wide-band-gap semiconductor.

11. An inverter wherein the semiconductor device according to claim 1 is used as a switching device.

* * * * *